(12) United States Patent
Yoo et al.

(10) Patent No.: US 10,861,878 B2
(45) Date of Patent: *Dec. 8, 2020

(54) SEMICONDUCTOR DEVICE HAVING FERROELECTRIC LAYER AND METHOD OF MANUFACTURING THE SAME

(71) Applicant: SK hynix Inc., Icheon-si (KR)

(72) Inventors: Hyangkeun Yoo, Icheon-si (KR); Joong Sik Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/663,236

(22) Filed: Oct. 24, 2019

(65) Prior Publication Data

US 2020/0066756 A1    Feb. 27, 2020

Related U.S. Application Data

(62) Division of application No. 15/975,721, filed on May 9, 2018, now Pat. No. 10,490,571.

(30) Foreign Application Priority Data

May 31, 2017   (KR) .................. 10-2017-0067730

(51) Int. Cl.
| | |
|---|---|
| *H01L 27/11597* | (2017.01) |
| *H01L 27/11504* | (2017.01) |
| *H01L 27/11514* | (2017.01) |
| *H01L 29/16* | (2006.01) |
| *H01L 29/51* | (2006.01) |
| *H01L 27/11587* | (2017.01) |
| *H01L 29/66* | (2006.01) |
| *H01L 27/11507* | (2017.01) |
| *H01L 29/78* | (2006.01) |

(52) U.S. Cl.
CPC .. *H01L 27/11597* (2013.01); *H01L 27/11504* (2013.01); *H01L 27/11514* (2013.01); *H01L 27/11587* (2013.01); *H01L 29/16* (2013.01); *H01L 29/516* (2013.01); *H01L 29/517* (2013.01); *H01L 29/6684* (2013.01); *H01L 27/11507* (2013.01); *H01L 29/78391* (2014.09)

(58) Field of Classification Search
None
See application file for complete search history.

(56) References Cited

U.S. PATENT DOCUMENTS

| | | |
|---|---|---|
| 9,337,210 B2 | 5/2016 | Karda et al. |
| 10,079,247 B2 * | 9/2018 | Kim .................. H01L 29/42356 |
| 2014/0065784 A1 | 3/2014 | Yoon et al. |

(Continued)

*Primary Examiner* — Alexander G Ghyka

(57) ABSTRACT

In a method of manufacturing a semiconductor device according to an embodiment of the present disclosure, a stacked structure including interlayer insulating layers and interlayer sacrificial layers that are alternately stacked is formed on a substrate. A trench is formed passing through the stacked structure on the substrate. A crystalline liner insulating layer is formed on a sidewall of the trench. A ferroelectric insulating layer and a channel layer are formed on the crystalline liner insulating layer. The interlayer sacrificial layers and the crystalline liner insulating layer are selectively removed to form a recess selectively exposing the ferroelectric insulating layer. The recess is filled with a conductive layer to form an electrode layer.

10 Claims, 16 Drawing Sheets

(56) References Cited

U.S. PATENT DOCUMENTS

| | | |
|---|---|---|
| 2016/0064510 A1 | 3/2016 | Mueller et al. |
| 2016/0118404 A1 | 4/2016 | Peng |
| 2016/0300883 A1 | 10/2016 | Bateman |
| 2017/0194419 A1 | 7/2017 | Lee et al. |
| 2018/0130823 A1 | 5/2018 | Kim |
| 2018/0277191 A1* | 9/2018 | Yoo ................. H01L 29/516 |
| 2018/0323199 A1 | 11/2018 | Roberts et al. |
| 2018/0358380 A1 | 12/2018 | Yoo |

* cited by examiner

SEMICONDUCTOR DEVICE HAVING FERROELECTRIC LAYER AND METHOD OF MANUFACTURING THE SAME

CROSS-REFERENCE TO RELATED APPLICATION

The present application is a divisional application of a U.S. patent application Ser. No. 15/975,721, filed on May 9, 2018, which claims priority under 35 U.S.C 119(a) to Korean Patent Application No. 10-2017-0067730, filed on May 31, 2017, which is herein incorporated by reference in its entirety.

BACKGROUND

1. Technical Field

Various embodiments of the present disclosure generally relate to a semiconductor device, and more particularly, relate to a semiconductor device having a ferroelectric layer and a method of manufacturing the same.

2. Related Art

Recently, a semiconductor device for recording signal information by changing electrical resistance of a thin film has been developed. The resistance state of a memory element in the semiconductor device reversibly changes corresponding to an externally applied current or voltage and the changed resistance state can be stored in a nonvolatile manner as predetermined electrical signal information. The nonvolatile storage device may include, for example, a magnetic random access memory (MRAM), a phase change random access memory (PCRAM), a resistive random access memory (ReRAM), a ferroelectric memory or the like.

Meanwhile, as a design rule decreases and integration degree increases, research on the structure of a semiconductor device that can guarantee both structural stability and reliability of storage operation has been continued. Recently, as a result of the research, a three-dimensional storage cell structure has been proposed.

SUMMARY

There is disclosed a method of manufacturing a semiconductor device according to an aspect of the present disclosure. In the method of manufacturing a semiconductor device, a stacked structure including interlayer insulating layers and interlayer sacrificial layers alternately stacked is formed on a substrate. A trench is formed passing through the stacked structure on the substrate. A crystalline liner insulating layer is formed on a sidewall of the trench. A ferroelectric insulating layer and a channel layer are formed on the crystalline liner insulating layer. The interlayer sacrificial layers and the crystalline liner insulating layer are selectively removed to form a recess selectively exposing the ferroelectric insulating layer. The recess is filled with a conductive material to form an electrode layer.

There is disclosed a semiconductor device according to another aspect of the present disclosure. The semiconductor device includes a stacked structure including interlayer insulating layers and electrode layers alternately stacked on a substrate. Also, the semiconductor device includes a trench that passes through the stacked structure on the substrate and exposes side surfaces of the interlayer insulating layers and electrode layers in a sidewall of the trench. In addition, the semiconductor device includes a ferroelectric insulating layer disposed on a sidewall of a trench passing through the stacked structure on the substrate and a crystalline liner insulating layer disposed between the sidewall surfaces of the interlayer insulating layers and the ferroelectric insulating layer in the trench.

DETAILED DESCRIPTION

Figure 1:
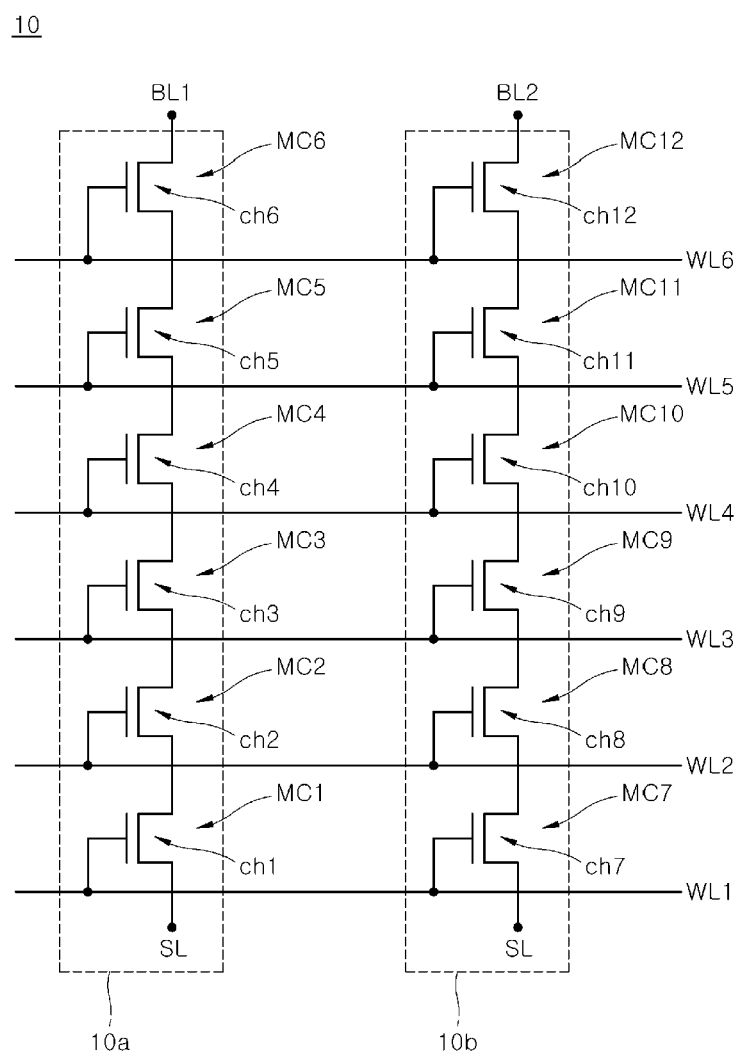
FIG. 1 is a circuit diagram schematically illustrating a semiconductor device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a circuit diagram schematically illustrating a semiconductor device 10 according to an embodiment of the present disclosure. In this embodiment, the semiconductor device 10 may include a transistor-type memory cell applying a ferroelectric insulating layer as a gate dielectric layer.

Referring to FIG. 1, the semiconductor device 10 may include a cell array having a plurality of strings 10a and 10b. One end of each of the strings 10a and 10b may be connected to a common source line SL, and another end of each of the strings 10a and 10b may be connected to different bit lines BL1 and BL2. Although, in FIG. 1, the configuration of the strings 10a and 10b are illustrated to have a first string 10a and a second string 10b for convenience of explanation, the present disclosure is not necessarily limited thereto and the number of strings constituting the cell array is not limited.

The first string 10a may have first to sixth memory cell transistors MC1, MC2, MC3, MC4, MC5 and MC6 connected in series to each other. The second string 10b may have seventh to twelfth memory cell transistors MC7, MC8, MC9, MC10, MC11 and MC12 connected in series to each other. Although, in FIG. 1, it is illustrated that the first and second strings 10a and 10b are each provided with six memory cell transistors for convenience of explanation, the present disclosure is not necessarily limited thereto and the number of memory cell transistors constituting the first and second strings 10a and 10b is not limited to six.

As illustrated in FIG. 1, the first to sixth memory cell transistors MC1, MC2, MC3, MC4, MC5 and MC6 in the first cell string 10a may be connected to different first to sixth word lines WL1, WL2, WL3, WL4, WL5 and WL6. Likewise, the seventh to twelfth memory cell transistors MC7, MC8, MC9, MC10, MC11 and MC12 in the second string 10b may be connected to different seventh to twelfth word lines WL7, WL8, WL9, WL10, WL11 and WL12.

In an embodiment, each of the first to twelfth memory cell transistors MC1, MC2, . . . , and MC12 may include a ferroelectric insulating layer as a gate dielectric layer. In the each of the first to twelfth memory cell transistors MC1, MC2, . . . , and MC12, an electric dipole in the ferroelectric insulating layer may be polarized in a predetermined direction when a gate voltage of a threshold voltage or higher is applied to a gate electrode layer through the first to sixth word lines WL1, WL2, WL3, WL4, WL5 and WL6. Also, even after the application of the gate voltage is completed, the ferroelectric insulating layer can maintain the polarization state of the electric dipole. The channel resistances ch1, ch2, . . . , and ch12 of the corresponding first to twelfth memory cell transistors MC1, MC2, . . . , and MC12 may vary depending on the polarization state of the ferroelectric insulating layer. At this time, the channel resistances ch1, ch2, . . . , and ch12 may mean electrical resistances represented by carriers that conduct along channel layers between the source and drain regions of the first to twelfth memory cell transistors MC1, MC2, . . . , and MC12. The polarization states of the electric dipoles of the ferroelectric insulating layers in the first to twelfth memory cell transistors MC1, MC2, . . . , and MC12 may be recorded in a nonvolatile manner, and the channel resistances ch1, ch2, . . . , and ch12 of the first to twelfth memory cell transistors MC1, MC2, . . . , and MC12 may be determined or measured as corresponding to the polarization states.

According to a method of driving a semiconductor device according to an embodiment of the present disclosure, the gate voltages applied from the first to sixth word lines WL1, WL2, WL3, WL4, WL5 and WL6 can be controlled independently. Accordingly, the channel resistances of the memory cell transistors MC1, MC2, MC3, MC4, MC5 and MC6 constituting the first string 10a can be determined or controlled independently. Meanwhile, the total channel resistance of the first string 10a is determined as the sum of the channel resistances of the memory cell transistors MC1, MC2, MC3, MC4, MC5 and MC6 connected in series to each other. Consequently, a plurality of different electric signals can be stored in the first string 10a by independently controlling the gate voltages applied to the gate electrode layers of the memory cell transistors MC1, MC2, MC3, MC4, MC5 and MC6.

Likewise, a plurality of different electric signals can be stored in the second string 10b by independently controlling the gate voltages applied to the gate electrode layers of the memory cell transistors MC7, MC8, MC9, MC10, MC11 and MC12.

According to an embodiment of the present disclosure, the semiconductor device may be implemented in a three-dimensional structure in which a plurality of memory cell transistors are vertically stacked between a source line and a bit line, as described below.

Figure 2A:
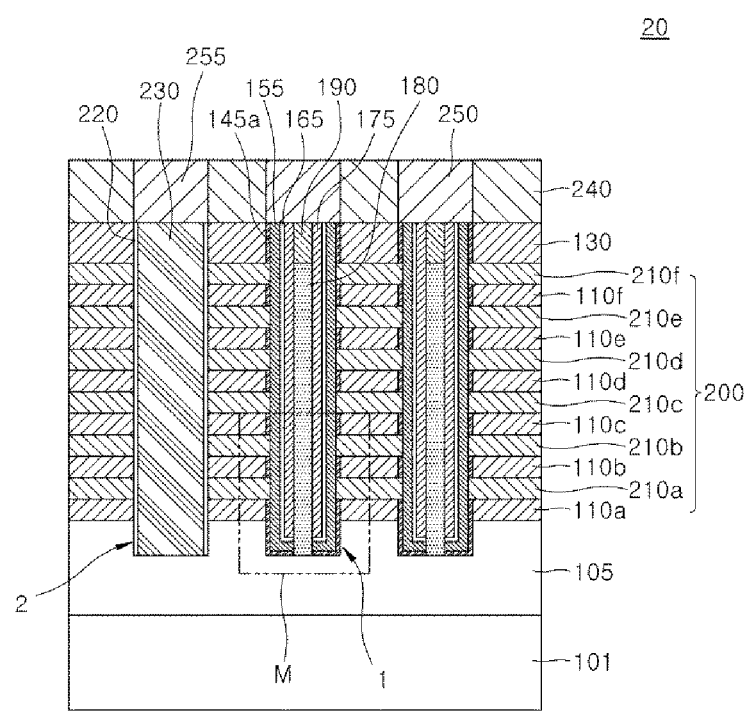
FIG. 2A is a cross-sectional view schematically illustrating a semiconductor device according to an embodiment of the present disclosure.
Figure 2B:
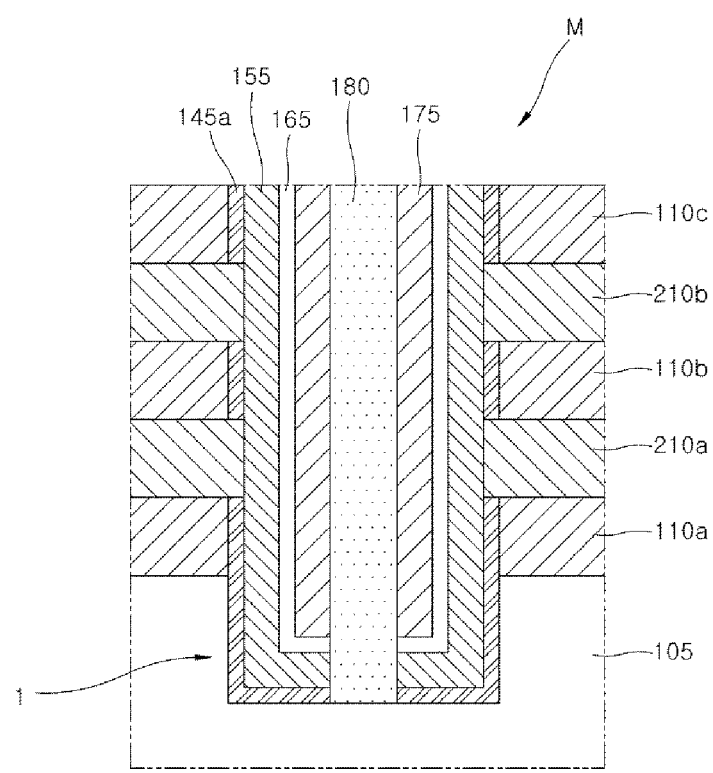
FIG. 2B is an enlarged view of an area M of FIG. 2A.

FIG. 2A is a cross-sectional view schematically illustrating a semiconductor 20 device according to an embodiment of the present disclosure. FIG. 2B is an enlarged view of the area M of FIG. 2A. The semiconductor device 20 according to an embodiment of the present disclosure may include a transistor-type memory cell applying a ferroelectric insulating layer as a gate dielectric layer.

Referring to FIGS. 2A and 2B, the semiconductor device 20 may include a substrate 101, a base conductive layer 105 on the substrate 101, and a stacked structure 200 disposed on the base conductive layer 105.

In an embodiment, the substrate 101 may be a semiconductor substrate. The semiconductor substrate may, for example, be a silicon (Si) substrate, a gallium arsenide (GaAs) substrate, an indium phosphide (InP) substrate, a germanium (Ge) substrate, or a silicon germanium (SiGe) substrate. The semiconductor substrate may be doped with an n-type dopant or a p-type dopant to have conductivity. In another embodiment, the substrate 101 may be an insulating substrate such as a silicon-on-insulator substrate. In another embodiment, the substrate 101 may be a conductive substrate such as a metal substrate.

The base conductive layer 105 may be disposed on the substrate 101. The base conductive layer 105 may include, for example, doped semiconductor, metal, conductive metal nitride, or conductive metal silicide. As an example, when the substrate 101 is a semiconductor substrate including a silicon material, the base conductive layer 105 may be a semiconductor material layer containing n-type doped silicon. As another example, the base conductive layer 105 may include tungsten (W), titanium (Ti), copper (Cu), aluminum (Al), tungsten nitride, titanium nitride, tantalum nitride, tungsten silicide, titanium silicide, tantalum silicide, or a combination of two or more thereof.

Although it is not illustrated, the substrate 101 may include a well doped with an n-type dopant or a p-type dopant. Various types of semiconductor integrated circuits may be arranged between the substrate 101 and the base conductive layer 105.

A stacked structure 200 may be disposed on the base conductive layer 105. The stacked structure 200 may include interlayer insulating layers 110a, 110b, 110c, 110d, 110e and 110f and electrode layers 210a, 210b, 210c, 210d, 210e and 210f that are alternately stacked.

The interlayer insulating layers 110a, 110b, 110c, 110d, 110e and 110f may include, for example, silicon oxide, silicon nitride, or silicon oxynitride. The electrode layers 210a, 210b, 210c, 210d, 210e and 210f may include, for example, metal, conductive metal oxide, conductive metal carbide, conductive metal silicide, or a combination of two or more thereof. The electrode layers 210a, 210b, 210c, 210d, 210e, and 210f may include, for example, tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, tantalum silicide, or a combination of two or more thereof.

Referring to FIGS. 2A and 2B, the semiconductor device 20 may include a first trench 1 that extends through the stacked structure 200 and reaches the base conductive layer 105. In some embodiments, the first trench 1 extends into the base conductive layer 105 on the substrate 101. In addition, the semiconductor device 20 may include a ferroelectric insulating layer 155, an interfacial insulating layer 165, and a channel layer 175 that are sequentially disposed on sidewall surfaces of the first trench 1. The ferroelectric insulating layer 155 may include, for example, hafnium oxide, zirconium oxide, hafnium zirconium oxide or a combination thereof. The ferroelectric insulating layer 155 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof. The ferroelectric insulating layer 155 may have a crystalline structure. As an example, the ferroelectric insulating layer 155 may have an orthorhombic crystal structure. The ferroelectric insulating layer 155 may, for example, have a thickness of about five (5) nanometers (nm) to about fifteen (15) nm.

The interfacial insulating layer 165 can suppress electrons traveling through the channel layer 175 from moving to the ferroelectric insulating layer 155 in a read operation to the semiconductor device 20, thereby preventing leakage current from being generated due to the electrons trapped in defect sites in the ferroelectric insulating layer 155. In addition, the interfacial insulating layer 165 can function to suppress diffusion of a material between the channel layer 175 and the ferroelectric insulating layer 155 during the manufacturing of the semiconductor device. The interfacial insulating layer 165 may include, for example, silicon oxide or aluminum oxide. The interfacial insulating layer 165 may have an amorphous phase. In some embodiments, the interfacial insulating layer 165 may be omitted. In such a case, the ferroelectric insulating layer 155 and the channel layer 175 may directly interface with each other.

The channel layer 175 may include, for example, a semiconductor material. The channel layer 175 may, for example, be an n-type doped silicon layer or an intrinsic silicon layer. The channel layer 175 may be connected to the base conductive layer 105 in the region of trench 1 extending under or beyond the stacked structure 200 and may be connected to a channel contact layer 190 on the stacked structure 200. A bit line connection pattern 250 may be disposed on the channel contact layer 190. The bit line connection pattern 250 may electrically connect the channel contact layer 190 to a bit line (not illustrated).

A filling material layer 180 filling the interior of the first trench 1 may be disposed on the channel layer 175. As an example, the filling material layer 180 may include oxide, nitride or oxynitride.

According to an embodiment of the present disclosure, the semiconductor device 20 may include a crystalline liner insulating layer 145a disposed between sidewall surfaces of the interlayer insulating layers 110a, 110b, 110c, 110d, 110e and 110f exposed by the first trench 1 and the ferroelectric insulating layer 155. Meanwhile, the crystalline liner insulating layer 145a may not be or is not disposed between the electrode layers 210a, 210b, 210c, 210d, 210e and 210f and the ferroelectric insulating layer 155.

As will be described later, the crystalline liner insulating layer 145a can function as a capping layer for a crystallization heat treatment of the ferroelectric insulating layer 155 in a manufacturing process of the semiconductor device 20.

After performing the crystallization heat treatment in the semiconductor device 20 using the crystalline liner insulating layer 145a, portions of the crystalline liner insulating layer 145a may be removed to permit portions of the ferroelectric insulating layer 155 to directly interface with the electrode layers 210a, 210b, 210c, 210d, 210e and 210f.

The crystalline liner insulating layer 145a may include, for example, magnesium oxide, calcium oxide, strontium oxide, barium oxide, aluminum oxide, gallium oxide, yttrium oxide, scandium oxide, tantalum oxide, zirconium oxide, hafnium zirconium oxide, titanium oxide, lanthanum oxide, gadolinium oxide, zirconium silicon oxide, hafnium silicon oxide, titanium silicon oxide, or a combination of two or more thereof.

The crystalline liner insulating layer 145a may, for example, have a paraelectric property or an antiferroelectric property. The crystalline liner insulating layer 145a may be thinner than the ferroelectric insulating layer 155. The crystalline liner insulating layer 145a may, for example, have a thickness of about one (1) nm to about five (5) nm. The crystalline liner insulating layer 145a may, for example, have a cubic or tetragonal crystal structure.

Referring again to FIG. 2A, the semiconductor device 20 may include a second trench 2 that extends through the stacked structure 200 and reaches and extends into the base conductive layer 105. The semiconductor device 20 may include a spacer insulating layer 220 disposed on an inner wall surface of the second trench 2, and a first source line connection pattern 230 filling the second trench 2 on the spacer insulating layer 220. The first source line connection pattern 230 may be directly electrically connected to the base conductive layer 105 at an interface at the bottom of the second trench 2. In addition, the first source line connection pattern 230 may be electrically connected to a second source line connection pattern 255 disposed on the first source line connection pattern 230. The second source line connection pattern 255 may electrically connect the first source line connection pattern 230 to a source line (not illustrated).

The second source line connection pattern 255 and the bit line connection pattern 250 may be electrically insulated from each other in a lateral direction on the stacked structure 200 by an interlayer insulating layer 240.

The semiconductor device 20 according the embodiment of the present disclosure may have a plurality of memory cell transistors vertically arranged on the base conductive layer 105. The plurality of memory cell transistors may include the electrode layers 210a, 210b, 210c, 210d, 210e and 210f that function as gate electrodes, respectively. The electrode layers 210a, 210b, 210c, 210d, 210e and 210f may be connected to different word lines (not illustrated), respectively. The gate electrode layers 210a, 210b, 210c, 210d, 210e and 210f can control independently the polarization state in the adjacent ferroelectric insulating layer 155 using a voltage applied from the word lines. Accordingly, the channel resistance of the channel layer 175 of each of the plurality of memory cell transistors can be independently controlled. Consequently, a string formed by vertically stacking a plurality of memory cell transistors can implement a plurality of different channel signals. Accordingly, the string can effectively store different electric signals, thereby implementing multi-level signals.

Figure 3:
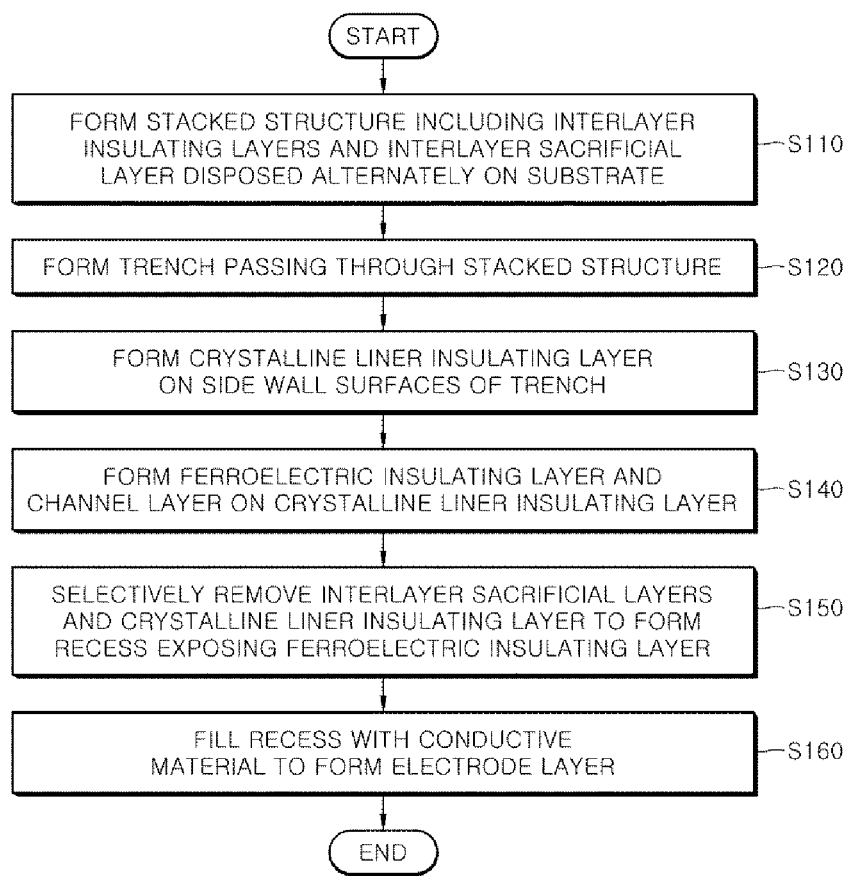
FIG. 3 is a flow chart schematically illustrating a method of manufacturing a semiconductor device according to an embodiment of the present disclosure.

FIG. 3 is a flow chart schematically illustrating a method of manufacturing a semiconductor device according to an embodiment of the present disclosure.

Referring to FIG. 3, in operation S110, a stacked structure may be formed on a substrate. At this time, the stacked structure may include interlayer insulating layers and interlayer sacrificial layers that are alternately stacked. The interlayer insulating layer and the interlayer sacrificial layer may have an etching selectivity with each other. In an embodiment, a base conductive layer may be formed between the substrate and the stacked structure.

In operation S120, a trench passing through the stacked structure may be formed on the substrate. Side surfaces of the interlayer insulating layers and the interlayer sacrificial layers may be exposed at the side wall surfaces of the trench.

In operation S130, a crystalline liner insulating layer may be formed on the side wall surfaces of the trench. The crystalline liner insulating layer may, for example, have paraelectricity or antiferroelectricity. The crystalline liner insulating layer may, for example, have a cubic or tetragonal crystal structure.

In an embodiment, the crystalline liner insulating layer may be formed by forming an amorphous metal oxide layer along the inner wall of the trench, and crystallizing the metal oxide layer by heat treatment. The metal oxide layer may include, for example, magnesium oxide, calcium oxide, strontium oxide, barium oxide, aluminum oxide, gallium oxide, yttrium oxide, scandium oxide, tantalum oxide, zirconium oxide, hafnium zirconium oxide, titanium oxide, lanthanum oxide, gadolinium oxide, zirconium silicon oxide, hafnium silicon oxide, titanium silicon oxide, or a combination of two or more thereof.

In operation S140, a ferroelectric insulating layer and a channel layer may be formed on the crystalline liner insulating layer. The ferroelectric insulating layer may include, for example, hafnium oxide, zirconium oxide, hafnium zirconium oxide, or a combination of two or more thereof. In an embodiment, the ferroelectric insulating layer may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof.

The ferroelectric insulating layer may be a crystalline layer. As an example, the ferroelectric insulating layer may have an orthorhombic crystal structure. A lattice constant of the ferroelectric insulating layer may be different from a lattice constant of the crystalline liner insulating layer. The channel layer may include, for example, a semiconductor material. The channel layer may include, for example, an n-type doped silicon layer or an intrinsic silicon layer.

In an embodiment, the ferroelectric insulating layer and the channel layer may be formed by sequentially forming an amorphous ferroelectric material layer and a semiconductor material layer or channel layer on the crystalline liner insulating layer, and performing crystallization heat treatment to the ferroelectric material layer utilizing the crystalline liner insulating layer as a capping layer.

In some embodiments, after forming the amorphous ferroelectric material layer, an interfacial insulating layer may further be formed on the amorphous ferroelectric material layer. The interfacial insulating layer may include silicon oxide or aluminum oxide. After the semiconductor material layer or channel layer is formed on the interfacial insulating layer, a crystallization heat treatment process may be performed.

Although it is not necessarily explicitly described in any one theory, if there is a certain kind of capping layer in contact with the amorphous ferroelectric material layer, as a result of the crystallization process, the amorphous ferroelectric material layer forms the ferroelectric insulating layer with improved ferroelectric properties.

In one example of the theory, when the capping layer has a different lattice constant from that of the ferroelectric material layer, a tensile strain or a compressive strain may be generated in the ferroelectric material layer during the crystallization heat treatment process. The stress due to the generated strain can convert the ferroelectric material layer into a ferroelectric insulating layer with a crystal structure having improved ferroelectricity. Thus, after the crystallization heat treatment, the ferroelectricity of the ferroelectric insulating layer can be effectively improved.

In another example of the theory, when the ferroelectric material layer includes a dopant element, then the capping layer can prevent the dopant element from diffusing out of the ferroelectric material layer. As a result, in the crystallization process, the ferroelectric material layer can maintain its atomic arrangement and ferroelectric properties. Thereafter, the crystallized ferroelectric insulating layer can have relatively improved ferroelectricity when the dopant element is retained.

In operation S150, the interlayer sacrificial layer and the crystalline liner insulating layer may be selectively removed to form a recess selectively exposing the ferroelectric insulating layer.

In an embodiment, the recess may be formed by selectively removing the interlayer sacrificial layer using a wet etch process to expose a side surface of the crystalline liner insulating layer, and performing wet etch to the exposed side surface of the crystalline liner insulating layer to expose a side surface of the ferroelectric insulating layer.

In operation S160, the recess may be filled with a conductive material to form an electrode layer. The electrode layer may include, for example, metal, metal nitride, metal carbide, metal silicide, or a combination of two or more thereof. The electrode layer may interface directly with the ferroelectric insulating layer.

Through the above-described processes, a semiconductor device according to an embodiment of the present disclosure can be manufactured. The semiconductor device may, for example, be a storage device having a plurality of memory cell transistors sequentially stacked in a vertical direction on a substrate.

FIGS. 4 to 15 are cross-sectional views schematically illustrating a method of manufacturing a semiconductor device according to an embodiment of the present disclosure.

Figure 4:
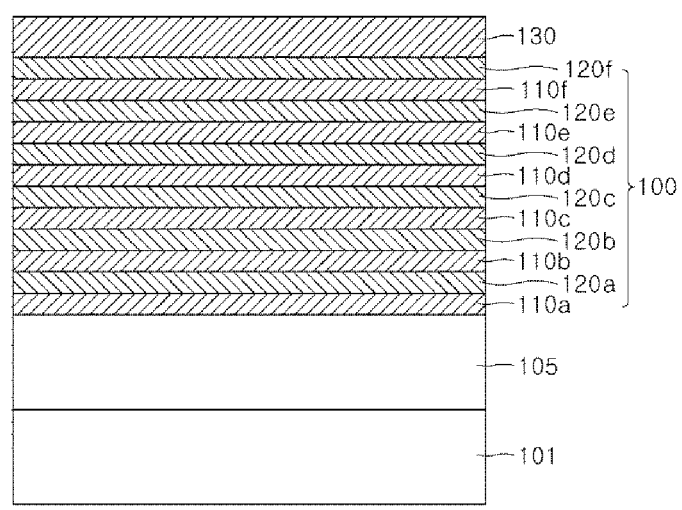
FIGS. 4 to 15 are cross-sectional views schematically illustrating a method of manufacturing a semiconductor device according to an embodiment of the present disclosure.

Referring to FIG. 4, a substrate 101 may be prepared. In an embodiment, the substrate 101 may be a semiconductor substrate. The semiconductor substrate may, for example, be a silicon (Si) substrate, a gallium arsenide (GaAs) substrate, an indium phosphide (InP) substrate, a germanium (Ge) substrate, or a silicon germanium (SiGe) substrate. The semiconductor substrate may be doped with an n-type dopant or a p-type dopant to have conductivity. In another embodiment, the substrate 101 may be an insulating substrate such as a silicon-on-insulator substrate. In another embodiment, the substrate 101 may be a conductive substrate such as a metal substrate.

A base conductive layer 105 may be formed on the substrate 101. The base conductive layer 105 may include, for example, doped semiconductor, metal, conductive metal nitride, or conductive metal silicide. In an embodiment, when the substrate 101 is a semiconductor substrate of a silicon material, the base conductive layer 105 may be a semiconductor material layer containing n-type doped silicon. The base conductive layer 105 may, for example, be formed using known methods such as chemical vapor deposition, atomic layer deposition, or sputtering.

Although it is not illustrated, the substrate 101 may include an n-type doped well region or a p-type doped well region. Various types of integrated circuits may be arranged between the substrate 101 and the base conductive layer 105.

A stacked structure 100 may be formed on the base conductive layer 105. The stacked structure 100 may be formed by sequentially stacking interlayer insulating layers 110a, 110b, 110c, 110d, 110e and 110f and interlayer sacrificial layers 120a, 120b, 120c, 120d, 120e and 120f. The interlayer insulating layers 110a, 110b, 110c, 110d, 110e and 110f and the interlayer sacrificial layers 120a, 120b, 120c, 120d, 120e and 120f may have etching selectivity with respect to each other. As an example, the interlayer insulating layers 110a, 110b, 110c, 110d, 110e and 110f may include oxide, and the interlayer sacrificial layers 120a, 120b, 120c, 120d, 120e and 120f may include nitride. As another example, the interlayer insulating layers 110a, 110b, 110c, 110d, 110e and 110f may include nitride and the interlayer sacrificial layers 120a, 120b, 120c, 120d, 120e and 120f may include oxide.

In an embodiment, when the stacked structure 100 is formed on the base conductive layer 105, the interlayer insulating layer 110a is firstly formed on the base conductive layer 105, and the interlayer sacrificial layer 120a may be formed on the interlayer insulating layer 110a. Then, another interlayer insulating layer and another interlayer sacrificial layer may be sequentially stacked on the interlayer sacrificial layer 120a.

In FIG. 4, the interlayer insulating layers 110a, 110b, 110c, 110d, 110e and 110f and the interlayer sacrificial layers 120a, 120b, 120c, 120d, 120e and 120f are composed of six layers, respectively, but not necessarily limited thereto. The number of the stacked layers of the interlayer insulating layers and interlayer sacrificial layers may be variously changed.

A first upper insulating layer 130 may be formed on an uppermost interlayer sacrificial layer 120f of the stacked structure 100. The first upper insulating layer 130 and the interlayer sacrificial layers 120a, 120b, 120c, 120d, 120e and 120f may have etching selectivity with respect to each other. As an example, the first upper insulating layer 130 may be formed of the same material as the interlayer insulating layers 110a, 110b, 110c, 110d, 110e and 110f. A thickness of the first upper insulating layer 130 may be greater than a thickness of the insulating layers 110a, 110b, 110c, 110d, 110e and 110f.

The interlayer insulating layers 110a, 110b, 110c, 110d, 110e and 110f, the interlayer sacrificial layers 120a, 120b, 120c, 120d, 120e and 120f, and the first upper insulating layer 130 may, for example, be formed using a chemical vapor deposition method, an atomic layer deposition method, a coating method or the like.

Figure 5:
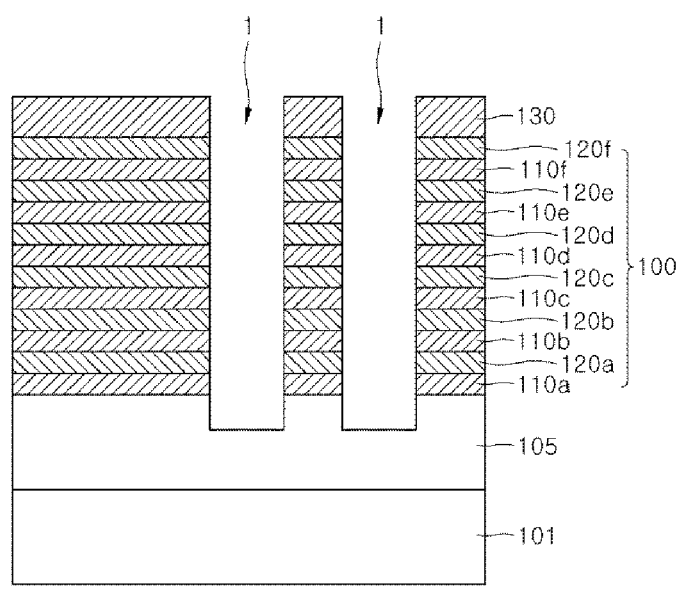

Referring to FIG. 5, a first trench 1 may be formed through the stacked structure 100 and the first upper insulating layer 130 to expose the base conductive layer 105. In an embodiment, the first trench 1 may be formed by performing anisotropic etching to the stacked structure 100 and the first upper insulating layer 130. As an example, the anisotropic etching may be performed by a dry etching method using plasma. As illustrated, a sidewall of the first trench 1 may expose side walls of the interlayer insulating layers 110a, 110b, 110c, 110d, 110e and 110f and interlayer sacrificial layers 120a, 120b, 120c, 120d, 120e and 120f, as well as the base conductive layer.

Figure 6:
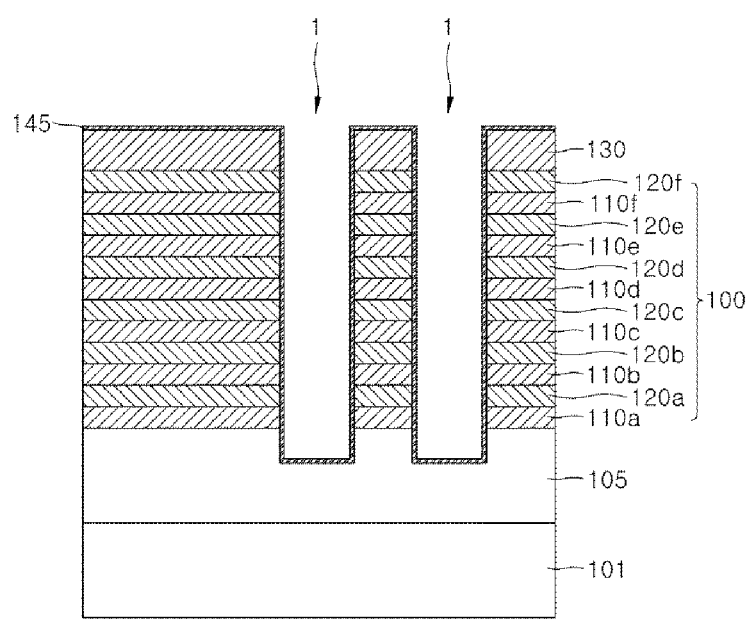

Referring to FIG. 6, a crystalline liner insulating layer 145 may be formed on an inner wall surface of the first trench 1 and on the first upper insulating layer 130 outside of the first trench 1. The crystalline liner insulating layer 145 may be formed by forming an amorphous metal oxide layer on the inner wall of the first trench 1 and on the first upper insulating layer 130 and crystallizing the metal oxide layer by heat treatment. In an embodiment, the metal oxide layer may, for example, be formed using an atomic layer deposition method, a chemical vapor deposition or the like. The heat treatment crystallization may, for example, be performed in an oxygen atmosphere or an inert gas atmosphere at a temperature ranging from about 400 Celcius (° C.) to about 100° C.

The metal oxide layer may include, for example, magnesium oxide, calcium oxide, strontium oxide, barium oxide, aluminum oxide, gallium oxide, yttrium oxide, scandium oxide, tantalum oxide, zirconium oxide, hafnium zirconium oxide, titanium oxide, lanthanum oxide, gadolinium oxide, zirconium silicon oxide, hafnium silicon oxide, titanium silicon oxide, or a combination of two or more thereof.

The crystalline liner insulating layer 145 may, for example, have a paraelectric property or an antiferroelectric property. The crystalline liner insulating layer 145 may have a cubic crystal structure or a tetragonal crystal structure, as an example. The crystalline liner insulating layer 145 may have a thickness of about one (1) nm to about five (5) nm.

Figure 7:
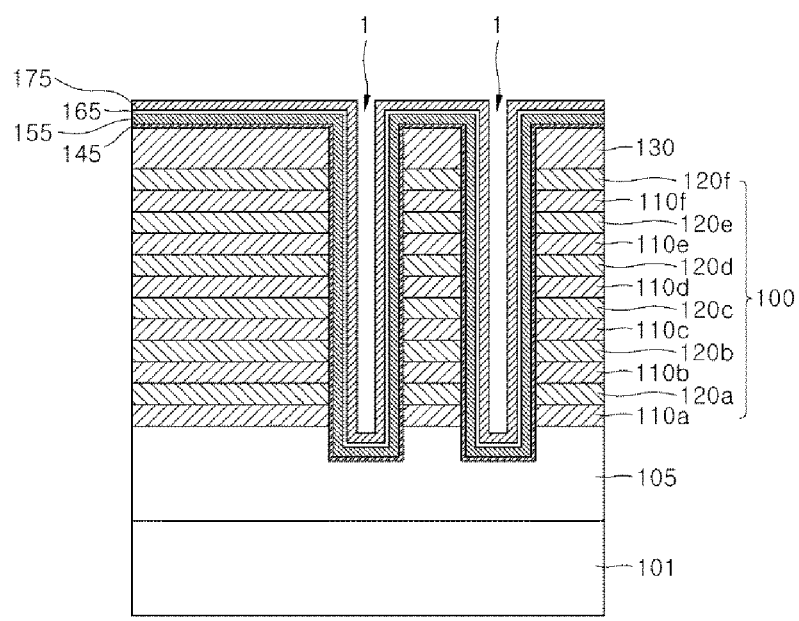

Referring to FIG. 7, a ferroelectric insulating layer 155, an interfacial insulating layer 165, and a channel layer 175 may be formed on the crystalline liner insulating layer 145. The ferroelectric insulating layer 155, the interfacial insulating layer 165, and the channel layer 175 may be formed as follows. First, an amorphous ferroelectric material layer may be formed on the crystalline liner insulating layer 145. Next, an insulating material layer to be used as the interfacial insulating layer 165 may be formed on the ferroelectric material layer. Next, a semiconductor material layer, which is applied as a channel layer 175, may be formed on the insulating material layer. Then, the stacked structure 100 may be heat-treated in an oxygen atmosphere or an inert gas atmosphere to crystallize the ferroelectric material layer. As a result, the ferroelectric insulating layer 155 having ferroelectricity can be formed.

The material layers used to form ferroelectric insulating layer 155, the interfacial insulating layer 165, and the channel layer 175 may, for example, be formed using an atomic layer deposition method, a chemical vapor deposition method or the like. The process of crystallizing the ferroelectric material layer may, for example, be performed at a temperature ranging from about 400° C. to about 1000° C.

Meanwhile, in the process of crystallizing the amorphous ferroelectric material layer, the crystalline liner insulating layer 145 can function as a capping layer for the ferroelectric material layer. A lattice constant of the crystalline liner insulating layer 145 may be different from a lattice constant of the ferroelectric insulating layer 155. As described above, if a capping layer covering the ferroelectric material layer is included when the amorphous ferroelectric material layer is crystallized through heat treatment, the ferroelectricity of the ferroelectric insulating layer 155 formed after crystallization can be improved. The ferroelectric insulating layer 155 may have an orthorhombic crystal structure, as an example. The ferroelectric insulating layer 155 may have a thickness of about five (5) nm to about fifteen (15) nm, as an example.

The ferroelectric material layer may include, for example, hafnium oxide, zirconium oxide, hafnium zirconium oxide, or a combination of two or more thereof. In an embodiment, the ferroelectric material layer may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof. The insulating material layer used to form interfacial insulating layer 165 may include, for example, silicon oxide or silicon nitride. The semiconductor material layer used to form channel layer 175 may include, for example, an n-type doped silicon layer or an intrinsic silicon layer.

Figure 8:
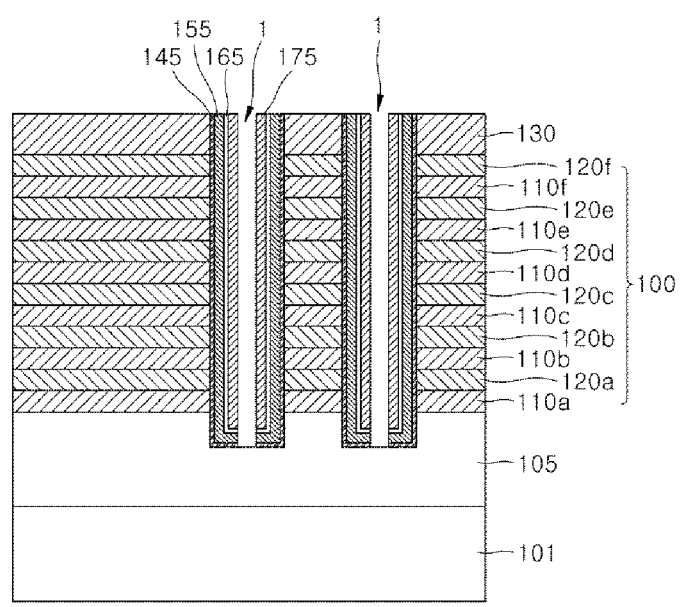

Referring to FIG. 8, the crystalline liner insulating layer 145, the ferroelectric insulating layer 155, the interfacial insulating layer 165 and the channel layer 175 that are formed on the inner wall of the first trench 1 and on the first upper insulating layer 130 may be anisotropically etched. As a result, portions of the crystalline liner insulating layer 145, the ferroelectric insulating layer 155, the interfacial insulating layer 165 and the channel layer 175 formed on a bottom surface of the first trench 1 and on an upper surface of the first upper insulating layer 130 are selectively removed. In an embodiment, the anisotropic etching may be performed by a dry etching method using plasma. In another embodiment, the anisotropic etching may be performed by an etch back method.

As a result of the anisotropic etching, the base conductive layer 105 at the bottom surface of the trench 1 may be exposed and the crystalline liner insulating layer 145, the ferroelectric insulating layer 155, the interfacial insulating layer 165 and the channel layer 175 may remain or be disposed on the side wall of the first trench 1.

Figure 9:
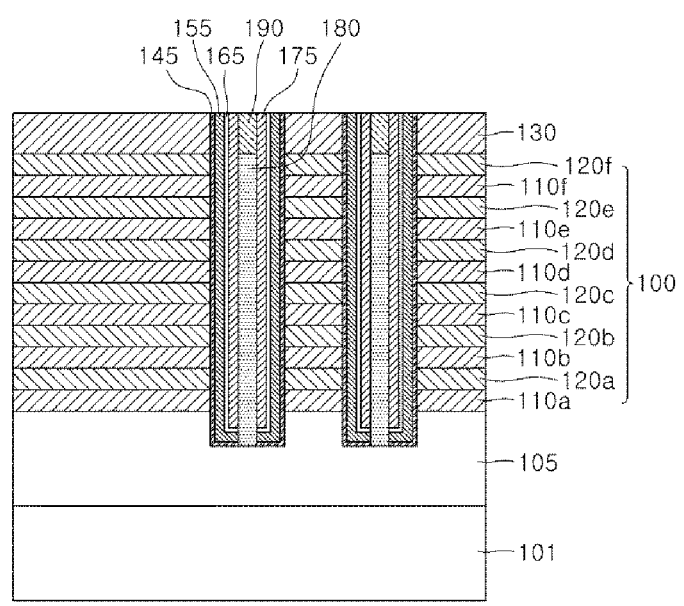

Referring FIG. 9, the first trench 1 may be filled with an insulating layer 180. The process of filling the first trench 1 may be performed by a chemical vapor deposition method, a coating method or the like. The insulating layer 180 may include, for example, silicon oxide, silicon nitride, silicon oxynitride or the like.

After filling the first trench 1 with the insulating layer 180, a planarization process for removing the insulating layer 180 existing on or common to the first upper insulating layer 130 may be performed. Thus, the upper surface of the embedded insulating layer 180 and the upper surface of the first upper insulating layer 130 can be positioned on the same plane. The planarization process may be performed by, for example, chemical mechanical polishing or an etch-back method.

Subsequently, the insulating layer 180 may be etched-back to form a recess inside the first trench 1. Next, the recess may be filled with a conductive layer to form a channel contact layer 190. The recess may be filled using, for example, a chemical vapor deposition method, a coating method or the like. A portion of the conductive layer, which is formed on the first upper insulating layer 130, may be further removed through a planarization process. Accordingly, an upper surface of the channel contact layer 190 and the upper surface of the first upper insulating layer 130 may be positioned on the same plane.

The channel contact layer 190 may include, for example, metal or metal nitride. The channel contact layer 190 may serve to reduce the resistance between the channel layer 175 and a bit line connection pattern 250 of FIG. 15 described below.

Figure 10:
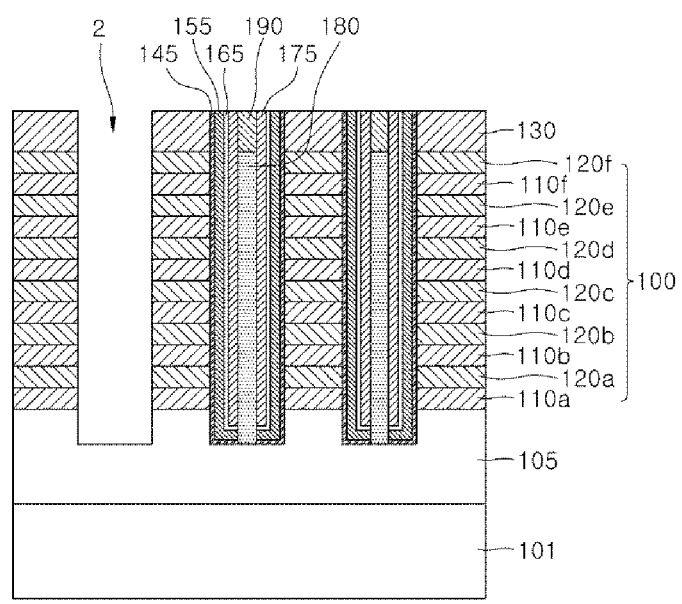

Referring to FIG. 10, a second trench 2 may be formed through the stacked structure 100 to expose the base conductive layer 105. Sidewall surfaces of the second trench 2 may expose the side surfaces of the interlayer insulating layers 110a, 110b, 110c, 110d, 110e and 110f, the side surfaces of the interlayer sacrificial layers 120a, 120b, 120c, 120d, 120e and 120f, the side surface of the first upper insulating layer 130, and side surfaces in the base conductive layer 105.

Figure 11:
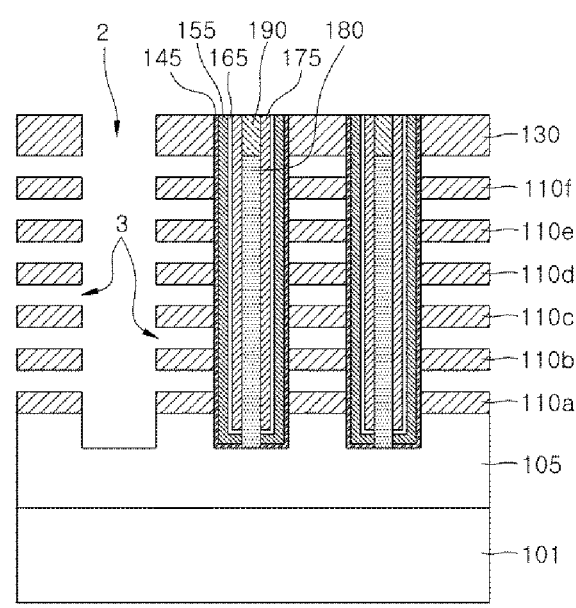

Referring to FIG. 11, the interlayer sacrificial layers 120a, 120b, 120c, 120d, 120e and 120f may be selectively removed using the second trench 2. In an embodiment, the sacrificial layers 120a, 120b, 120c, 120d, 120e and 120f may be selectively removed by providing, into the second trench 2, an etchant having an etching selectivity with the first upper insulating layer 130. Next, wet-etching of the sacrificial layers 120a, 120b, 120c, 120d, 120e and 120f using the etchant occurs. As a result, first recesses 3 exposing portions of the side surface of the crystalline liner insulating layer 145 can be formed.

Figure 12:
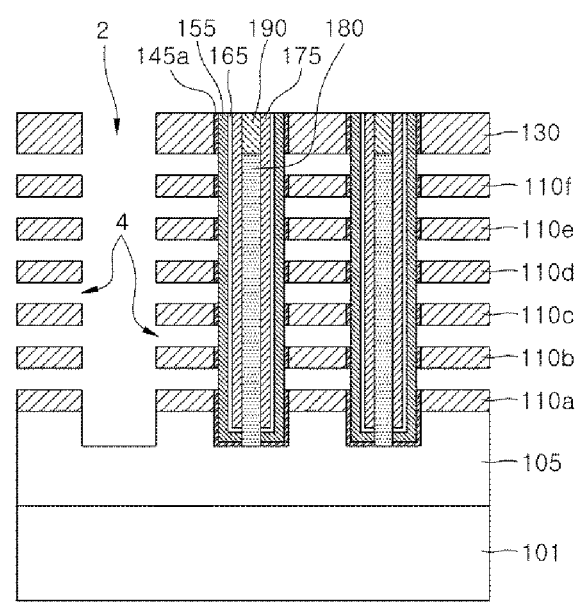

Referring to FIG. 12, the crystalline liner insulating layer 145 exposed by the first recesses 3 may be selectively removed. The crystalline liner insulating layer 145 may be selectively removed using a wet etching process. As a result, second recesses 4 that selectively expose portions of the ferroelectric insulating layer 155 can be formed. Accordingly, the crystalline liner insulating layer 145 from which portions of the side surface are removed may remain as the crystalline liner insulating layer 145a in the form of a pattern. The crystalline liner insulating layer 145a may be positioned between the sidewall surfaces of the interlayer insulating layers 110a, 110b, 110c, 110d, 110e and 110f in the first trench 1 and the ferroelectric insulating layer 155. On the other hand, the crystalline liner insulating layer 145a does not exist between the electrode layers 210a, 210b, 210c, 210d, 210e and 210f and the ferroelectric insulating layer 155.

In some embodiments, the processes of forming the first recesses 3 and the second recesses 4 may be carried out collectively at or around the same time. That is, at the time of forming the first recesses 3, the interlayer sacrifice layers 120a, 120b, 120c, 120d, 120e and 120f and the crystalline liner insulating layer 145 may be removed together by one or more wet etching liquids.

Figure 13:
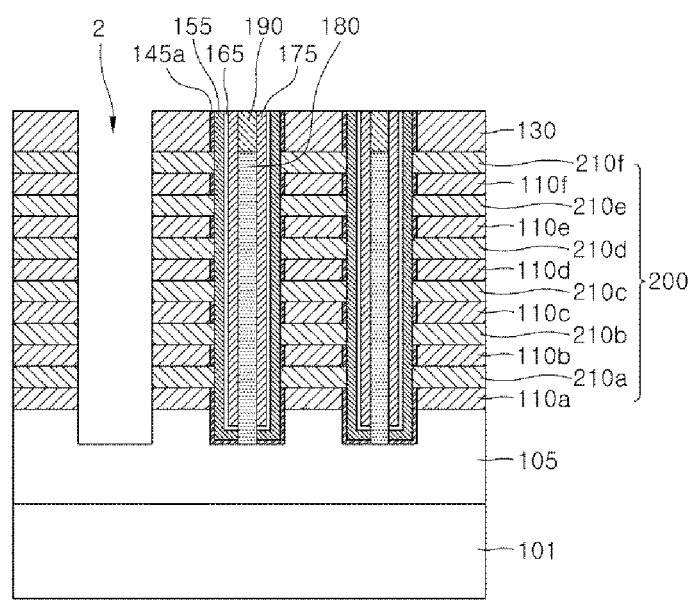

Referring to FIG. 13, the first and second recesses 3 and 4 may be filled with a conductive material to form electrode layers 210a, 210b, 210c, 210d, 210e and 210f. The electrode layers 210a, 210b, 210c, 210d, 210e and 210f may contact exposed portions of the side surface of the ferroelectric insulating layer 155. The electrode layers 210a, 210b, 210c, 210d, 210e and 210f may include, for example, metal, conductive metal nitride, conductive metal carbide, conductive metal silicide, or a combination of two or more thereof. The electrode layers 210a, 210b, 210c, 210d, 210e and 210f may include, for example, tungsten (W), titanium (Ti), copper (Cu), tungsten nitride, titanium nitride, tantalum nitride, tungsten carbide, titanium carbide, tungsten silicide, titanium silicide, tantalum silicide, or a combination of two or more thereof.

Figure 14:
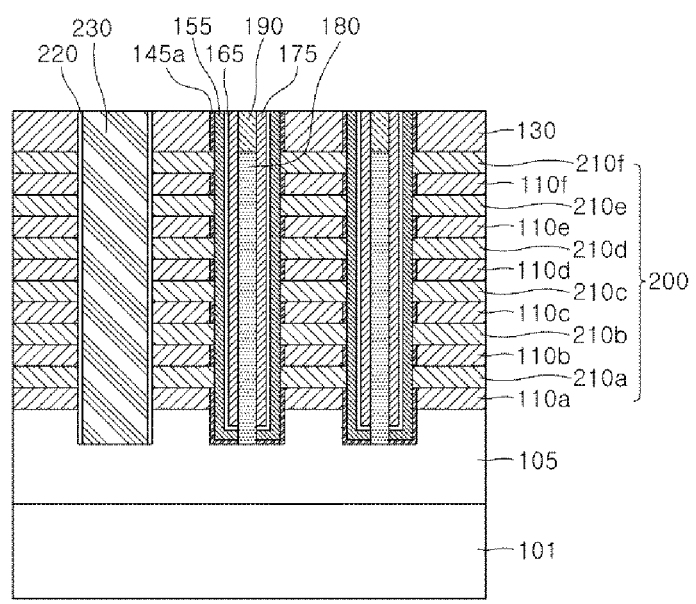

Referring to FIG. 14, a spacer insulating layer 220 may be formed on the sidewall surface of the second trench 2. The spacer insulating layer 220 may be formed by forming an insulating layer along the sidewall surface of the second trench 2 and performing anisotropic etching to the insulating layer to remove a portion of the insulating layer on a bottom of the second trench 2. The insulating layer may be formed, for example, using a chemical vapor deposition method or an atomic layer deposition method.

Next, the second trench 2 in which the spacer insulating layer 220 is formed may be filled with a conductive material to form a first source line connection pattern 230. The first source line connection pattern 230 may include, for example, conductive metal nitride, conductive metal carbide, conductive metal silicide, or a combination of two or more thereof. The first source line connection pattern 230 may include, for example, tungsten (W), titanium (Ti), copper (Cu), tungsten nitride, titanium nitride, tantalum nitride, tungsten carbide, titanium carbide, tungsten silicide, titanium silicide, tantalum silicide, or a combination of two or more thereof.

The spacer insulating layer 220 may electrically insulate the first source line connection pattern 230 and the electrode layers 210a, 210b, 210c, 210d, 210e and 210f.

Figure 15:
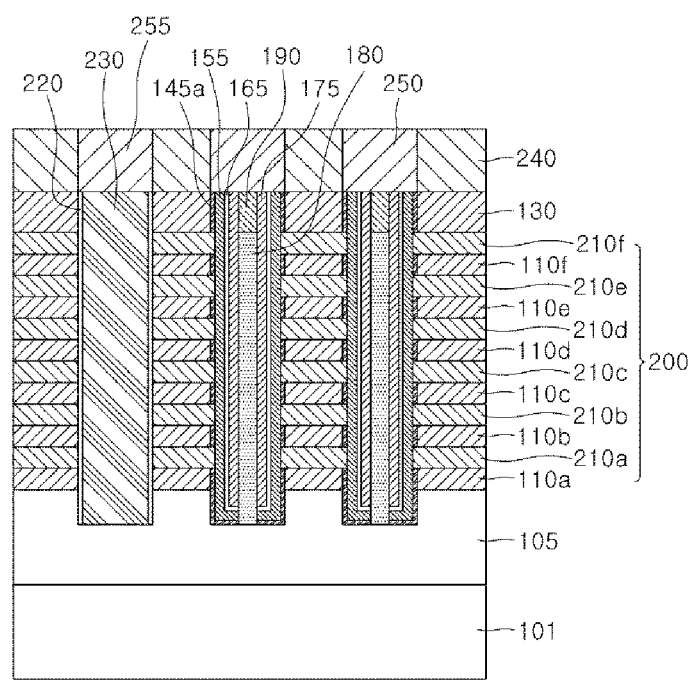

Referring to FIG. 15, a second upper insulating layer 240 may be formed on the first upper insulating layer 130. The second upper insulating layer 240 may include, for example, silicon oxide, silicon nitride, or silicon oxynitride. The second upper insulating layer 240 may, for example, be formed using a chemical vapor deposition method or a coating method.

Next, a bit line connection pattern 250 electrically connected to the channel contact layer 190 may be formed in the second upper insulating layer 240. In addition, a second source line connection pattern 255 electrically connected to the first source line connection pattern 230 may be formed in the second upper insulating layer 240. The process of forming the bit line connection pattern 250 and the second source line connection pattern 255 may proceed as follows. The second upper insulating layer 240 may be selectively etched to form a contact pattern exposing the channel contact layer 190 and the first source line connection pattern 230, respectively. Then, the contact pattern may be filled with a conductive material. The conductive material may include, for example, tungsten (W), titanium (Ti), copper (Cu), tungsten nitride, titanium nitride, tantalum nitride, tungsten carbide, titanium carbide, tungsten silicide, titanium silicide, tantalum silicide, or a combination of two or more thereof.

The first and second source line connection patterns 230 and 255 may electrically connect the base conductive layer 105 to a source line (not illustrated) of the semiconductor device. The bit line connection pattern 250 can electrically connect the channel layer 175 to a bit line (not illustrated).

By performing the above-described processes, a semiconductor device according to an embodiment of the present disclosure can be manufactured. According to the embodiment described above, it is possible to provide a method of manufacturing a storage device of a three-dimensional structure, in which the ferroelectric insulating layer 155 and the electrode layers 210a, 210b, 210c, 210d, 210e and 210f are applied as a gate dielectric layer and a gate electrode layer. In the manufacturing process, the crystalline liner insulating layer 145 may be disposed to cover the ferroelectric material layer and may effectively perform the role of a capping layer for the ferroelectric material layer during the crystallization heat treatment of the ferroelectric material layer. Accordingly, after the crystallization heat treatment, the ferroelectricity of the ferroelectric insulating layer 155 can be effectively improved. Consequently, it is possible to provide a semiconductor device with structural and functional reliability assured and a manufacturing method thereof.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A semiconductor device comprising:
    a stacked structure including interlayer insulating layers and electrode layers alternately stacked on a substrate;
    a trench, passing through the stacked structure into the substrate, that exposes side surfaces of the interlayer insulating layers and electrode layers in a sidewall of the trench;
    a ferroelectric insulating layer disposed on the sidewall of the trench; and
    a crystalline liner insulating layer disposed between the side surfaces of the interlayer insulating layers and the ferroelectric insulating layer.

2. The semiconductor device of claim 1, further comprising:
    a channel layer disposed on the ferroelectric insulating layer; and
    a source line connection pattern and a bit line connection pattern that are disposed over and below the stacked structure, respectively and electrically connected to the channel layer.

3. The semiconductor device of claim 1, further comprising a word line electrically connected to the electrode layer,
    wherein a remanent polarization state in the ferroelectric insulating layer in contact with the electrode layer is determined by a voltage applied to the word line.

4. The semiconductor device of claim 1, wherein a lattice constant of the crystalline liner insulating layer is different from a lattice constant of the ferroelectric insulating layer.

5. The semiconductor device of claim 1, herein the crystalline liner insulating layer comprises at least one selected from the group consisting of magnesium oxide, calcium oxide, strontium oxide, barium oxide, aluminum oxide, gallium oxide, yttrium oxide, scandium oxide, tantalum oxide, zirconium oxide, hafnium zirconium oxide, titanium oxide, lanthanum oxide, gadolinium oxide, zirconium silicon oxide, hafnium silicon oxide, and titanium silicon oxide.

6. The semiconductor device of claim 1, wherein the ferroelectric insulating layer comprises at least one of hafnium oxide, zirconium oxide, and hafnium zirconium oxide.

7. The semiconductor device of claim 6, wherein the ferroelectric insulating layer comprises at least one selected from the group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), and gadolinium (Gd).

8. The semiconductor device of claim 1, wherein a thickness of the crystalline liner insulating layer is thinner than a thickness of the ferroelectric insulating layer.

9. The semiconductor device of claim 1, wherein the crystalline liner insulating layer has a thickness of 1 nm to 5 nm, and the ferroelectric insulating layer has a thickness of 5 nm to 15 nm.

10. The semiconductor device of claim 1, wherein the electrode layer comprises at least one selected from the group consisting of tungsten (W), titanium (Ti), copper (Cu), aluminum (Al), platinum (Pt), iridium (Ir), ruthenium (Ru), tungsten nitride, titanium nitride, tantalum nitride, iridium oxide, ruthenium oxide, tungsten carbide, titanium carbide, tungsten silicide, titanium silicide, and tantalum silicide.

* * * * *